United States Patent
Matoba et al.

(10) Patent No.: US 11,789,363 B2
(45) Date of Patent: Oct. 17, 2023

(54) POSITIVE PHOTOSENSITIVE RESIN COMPOSITION, CURED FILM THEREFROM, AND SOLID STATE IMAGE SENSOR COMPRISING THE SAME

(71) Applicant: TORAY INDUSTRIES, INC., Tokyo (JP)

(72) Inventors: Yoshinori Matoba, Otsu (JP); Toshiyasu Hibino, Otsu (JP); Mitsuhito Suwa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 628 days.

(21) Appl. No.: 17/041,639

(22) PCT Filed: Mar. 27, 2019

(86) PCT No.: PCT/JP2019/013238
§ 371 (c)(1),
(2) Date: Sep. 25, 2020

(87) PCT Pub. No.: WO2019/189387
PCT Pub. Date: Oct. 3, 2019

(65) Prior Publication Data
US 2021/0116812 A1   Apr. 22, 2021

(30) Foreign Application Priority Data
Mar. 30, 2018  (JP) ................. 2018-067923

(51) Int. Cl.
*G03F 7/075* (2006.01)
*G03F 7/022* (2006.01)
(Continued)

(52) U.S. Cl.
CPC ............ *G03F 7/0226* (2013.01); *G03F 7/008* (2013.01); *G03F 7/0042* (2013.01);
(Continued)

(58) Field of Classification Search
CPC .... G03F 7/0226; G03F 7/0233; G03F 7/0757; G03F 7/0042; G03F 7/0043; G03F 7/38; G03F 7/40
See application file for complete search history.

(56) References Cited

U.S. PATENT DOCUMENTS

2010/0280210 A1  11/2010 Kitamura et al.
2011/0230584 A1  9/2011 Araki et al.
(Continued)

FOREIGN PATENT DOCUMENTS

JP   2013-18850 A   1/2013
JP   2013-147659 A  8/2013
(Continued)

OTHER PUBLICATIONS

International Search Report, issued in PCT/JP2019/012238, PCT/ISA/210, dated Jun. 11, 2019.
(Continued)

*Primary Examiner* — John S Chu
(74) *Attorney, Agent, or Firm* — Birch, Stewart, Kolasch & Birch, LLP

(57) ABSTRACT

The present invention provides a positive photosensitive resin composition having high light transmittance, high heat resistance, and excellent pattern processability. The present invention provides a positive photosensitive resin composition containing polysiloxane (A), a naphthoquinonediazide compound (B), and a solvent (C); in which the polysiloxane (A) has at least one structure selected from the following general formulae (1) to (3), and has at least one structure selected from the following general formulae (4) to (6);

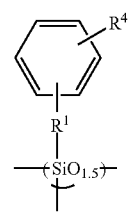

(1)

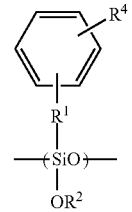

(2)

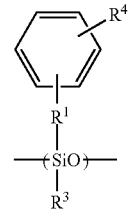

(3)

in which, in the general formulae (1) to (3), $R^4$ represents a $C_2$-$C_6$ hydrocarbon group having an unsaturated double bond; $R^1$ represents a single bond or a $C_1$-$C_4$ alkylene group; $R^2$ in the general formula (2) represents a hydrogen atom or a $C_1$-$C_4$ alkyl group; and $R^3$ in the general formula (3) represents an organic group;

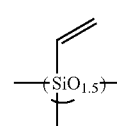

(4)

(Continued)

-continued

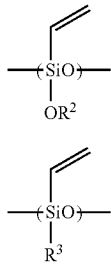

in which $R^2$ in general formula (5) represents a hydrogen atom or a $C_1$-$C_4$ alkyl group; and $R^3$ in the general formula (6) represents an organic group.

10 Claims, No Drawings

(51) Int. Cl.
G03F 7/023 (2006.01)
G03F 7/40 (2006.01)
G03F 7/008 (2006.01)
G03F 7/039 (2006.01)
G03F 7/20 (2006.01)
G03F 7/004 (2006.01)
G03F 7/38 (2006.01)

(52) U.S. Cl.
CPC .......... G03F 7/0043 (2013.01); G03F 7/0392 (2013.01); G03F 7/0757 (2013.01); G03F 7/2004 (2013.01); G03F 7/38 (2013.01); G03F 7/40 (2013.01)

(56) References Cited

U.S. PATENT DOCUMENTS

| | | | |
|---|---|---|---|
| 2014/0087136 A1* | 3/2014 | Osaku | G03F 7/038 428/141 |
| 2014/0242787 A1* | 8/2014 | Fujiwara | G03F 7/0757 528/10 |
| 2016/0137879 A1 | 5/2016 | Miki et al. | |
| 2017/0010532 A1 | 1/2017 | Iimori et al. | |
| 2017/0243737 A1* | 8/2017 | Tanigaki | G03F 7/423 |
| 2017/0285477 A1* | 10/2017 | Tanigaki | G03F 7/0758 |
| 2017/0293224 A1* | 10/2017 | Kamemoto | G03F 7/0233 |

FOREIGN PATENT DOCUMENTS

| | | |
|---|---|---|
| JP | 2014-237771 A | 12/2014 |
| JP | 5822048 B2 | 11/2015 |
| JP | 2017-97378 A | 6/2017 |
| WO | WO 2010/061744 A1 | 6/2010 |
| WO | WO 2015/111607 A1 | 7/2015 |

OTHER PUBLICATIONS

Written Opinion of the International Searching Authority, issued in PCT/JP2019/012238, PCT/ISA/237, dated Jun. 11, 2019.

* cited by examiner

POSITIVE PHOTOSENSITIVE RESIN COMPOSITION, CURED FILM THEREFROM, AND SOLID STATE IMAGE SENSOR COMPRISING THE SAME

TECHNICAL FIELD

The present invention relates to positive photosensitive resin compositions, cured films therefrom, and solid state image sensors comprising the same.

BACKGROUND ART

In recent years, the rapid development of digital cameras, camera phones, and the like has been accompanied by the demand for smaller solid state image sensors with higher pixel size. The downsizing of solid state image sensors leads to a decrease in the efficiency of light utilization and a consequent decrease in sensitivity. In order to prevent the loss of sensitivity, microlenses are provided on the color filter at the light intake by pixels so that light can be focused efficiently.

A general method of producing microlenses include applying a material for forming microlenses; curing the material; applying a photoresist thereon; exposing and developing the photoresist; subjecting it to pattern processing into the size of microlens; and subjecting the material for forming microlenses to dry etching into microlens shape using the photoresist as a mask.

Materials for forming microlenses are required to have high refractive index for efficient light condensation, as well as to have excellent moisture resistance, chemical resistance, and the like while maintaining high transmittance. Polysiloxane resins are used as resins meeting such requirements.

For example, Patent Literature 1 discloses a positive siloxane resin composition for forming microlenses, the siloxane resin composition having groups such as vinyl, styryl, and acryloyloxy on its side chain. Patent Literature 2 discloses a positive siloxane resin composition exhibiting low refractive index and containing a fluorine atom in its side chain.

CITATION LIST

Patent Literature

Patent Literature 1: JP 2009-223293 A
Patent Literature 2: JP 2015-92242 A

SUMMARY OF INVENTION

Technical Problem

In recent years, the downsizing of solid state image sensors has been accompanied by the need for capturing light as much as possible in a smaller area, which increases the demand for photosensitive materials showing high refractive index, high light transmittance, and high heat resistance, as well as excellent pattern processability. The technologies disclosed in Patent Literatures 1 and 2 are insufficient as photosensitive materials having high refractive index and excellent pattern processability.

An object of the present invention is to provide a positive photosensitive resin composition having high refractive index, high heat resistance, and excellent pattern processability.

Solution to Problem

The present invention for solving such problems comprises the following aspects.

Advantageous Effects of Invention

The resin composition of the present invention shows high refractive index, light transmittance, heat resistance, and light resistance, as well as excellent pattern processability.

DESCRIPTION OF EMBODIMENTS

The present invention provides a positive photosensitive resin composition comprising:
polysiloxane (A),
a naphthoquinonediazide compound (B), and
a solvent (C);
wherein the polysiloxane (A) has at least one structure selected from the following general formulae (1) to (3), and has at least one structure selected from the following general formulae (4) to (6);

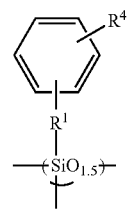

(1)

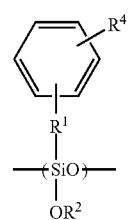

(2)

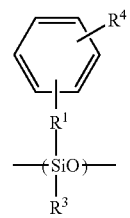

(3)

In the general formulae (1) to (3), $R^4$ represents a $C_2$-$C_6$ hydrocarbon group having an unsaturated double bond, and $R^1$ represents a single bond or a $C_1$-$C_4$ alkylene group. $R^2$ in the formula (2) represents a hydrogen atom or a $C_1$-$C_4$ alkyl group. $R^3$ in the general formula (3) represents an organic group. The description of 1.5 oxygen atoms in the general formula (1) means that, as for the three bonds toward right and left, and downward of the silicon atom, one oxygen atom exists in the one binding direction and 0.5 oxygen atoms exist in one of the other binding directions. The description of one oxygen atom shown in the right side of the silicon atom in the general formula (2) and (3) means that, as for the two bonds toward the right and left of the silicon atom, 0.5 oxygen atoms exist in both of the right and left directions.

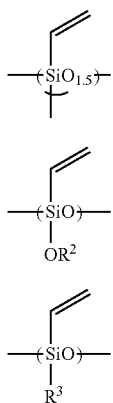

R² in general formula (5) represents a hydrogen atom or a $C_1$-$C_4$ alkyl group. R³ in the general formula (6) represents an organic group. Preferably, the carbon number of R³ is from 1 to 8. The description of 1.5 oxygen atoms in the general formula (4) means that, as for the three bonds toward right and left, and downward of the silicon atom, one oxygen atom exists in the one binding direction and 0.5 oxygen atoms exist in one of the other binding directions. The description of one oxygen atom shown in the right side of the silicon atom in the general formula (5) and (6) means that, as for the two binding directions toward the right and left of the silicon atom, 0.5 oxygen atoms exist in both of the right and left directions.

<Polysiloxane (A)>

Polysiloxane used in the present invention has at least one structure selected from the following general formulae (1) to (3), and has at least one structure selected from the following general formulae (4) to (6).

When polysiloxane has a styryl group, the cured product can be imparted with higher heat resistance, light resistance, and higher refractive index. Furthermore, heat resistance and light resistance to be required can be achieved by curing at lower temperature. Preferably, the molar ratio of the styryl group relative to silicon atoms is from 10 to 90 mol %. The lower limit is more preferably 20 mol % or more, still more preferably 30 mol % or more. The upper limit is more preferably 85 mol % or less, still more preferably 80 mol % or less.

When polysiloxane is composed only of a silicon atom directly or indirectly bound to a styryl group, polysiloxane residue is more likely to be produced after exposure and development with a developer. This is probably because crosslinking reaction is more likely to occur by the Diels-Alder reaction.

It has been found that copolymerization with a proper amount of siloxane having a silicon atom directly bound to a vinyl group can reduce production of the residue. Such a polysiloxane has at least one structure selected from the general formulae (4) to (6) described above.

The amount of vinyl group directly bound to a silicon atom derived from the general formulae (4) to (6) is preferably from 1 to 20 mol % relative to silicon atoms in polysiloxane. The lower limit is more preferably 3 mol % or more, still more preferably 5 mol % or more. The upper limit is more preferably 15 mol % or less, still more preferably 10 mol % or less. When the percentage is small, crosslinking reaction by styryl group greatly progresses during prebaking, resulting in poor resolution in pattern processing. When the percentage is too large (over the upper limit), more residues occur during pattern formation due to high hydrophobicity of vinyl group.

Styryl and vinyl groups undergo thermal polymerization during heat curing and thus contribute to the heat resistance and chemical resistance of the cured product. On the other hand, these functional groups increase the hydrophobicity of the polysiloxane. Thus, when the resin composition is spin-coated onto a substrate, wetting and spreading tend to be poor on the periphery of the substrate. For uniform application to the periphery of the substrate, it is preferable to introduce hydrophilic groups into the polysiloxane. Copolymerization with an alkoxysilane compound material provides polysiloxane having hydrophilic groups such as silanol groups. This results in improved coating properties of the resin composition on the substrate. This can lead to improved yield without loss of the periphery of substrates.

Alkoxysilane compounds that provide polysiloxane with a hydrophilic group are commercially available and easy to obtain.

Specific examples of an alkoxysilane compound material that provides polysiloxane with a styryl group include:

styryltrimethoxysilane, styryltriethoxysilane, styryltri(methoxyethoxy)silane, styryltri(propoxy)silane, styryltri(butoxy)silane, styrylmethyldimethoxysilane, styrylethyldimethoxysilane, styrylmethyldiethoxysilane, and styrylmethyldi(methoxyethoxy)silane.

Specific examples of an alkoxysilane compound material that provides polysiloxane with a vinyl group include: vinyltrimethoxysilane, vinyltriethoxysilane, vinyltri-n-propoxysilane, vinyltriisopropoxysilane, vinyltriacetoxysilane, vinylmethyldimethoxysilane, vinylmethyldiethoxysilane, vinylmethyldi-n-propoxysilane, vinylmethyldi-1-propoxysilane, vinylethyldimethoxysilane, vinylmethyldiethoxysilane, vinylethyldi-n-propoxysilane, vinylethyldi-1-propoxysilane, vinylphenyldimethoxysilane, vinylphenyldiethoxysilane, vinylphenyl-n-propoxysilane, and vinylphenyl-1-propoxysilane, which are preferably used.

An alkoxysilane compound having a dicarboxylic anhydride group is also preferably used as an alkoxysilane compound having a hydrophilic group. Examples of the alkoxysilane compound having a dicarboxylic anhydride group include organosilane compounds represented by the following general formulae (7) to (9).

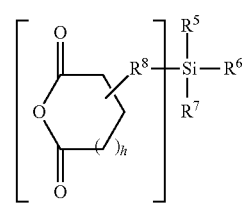

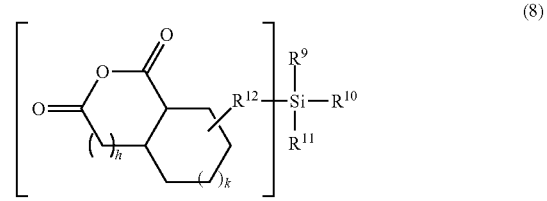

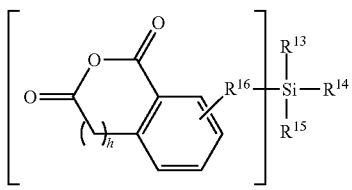

(9)

In the formula, $R^5$ to $R^7$, $R^9$ to $R^{11}$, and $R^{13}$ to $R^{15}$ represent a $C_1$-$C_6$ alkyl group, a $C_1$-$C_6$ alkoxyl group, a phenyl group, a phenoxy group, or a substituted group thereof. $R^8$, $R^{12}$, and $R^{16}$ represent a single bond, or a linear aliphatic hydrocarbon group, a cyclic aliphatic hydrocarbon group, a carbonyl group, an ether group, an ester group, an amide group, an aromatic group, or divalent group having any of them. These groups may be substituted. k and h represent an integer from 0 to 3.

Specific examples of $R^8$, $R^{12}$, and $R^{16}$ include —$C_2H_4$—, —$C_3H_6$—, —$C_4H_8$—, —O—, —$C_3H_6OCH_2CH(OH)CH_2O_2C$—, —CO—, —$CO_2$—, —CONH—, and organic groups listed below.

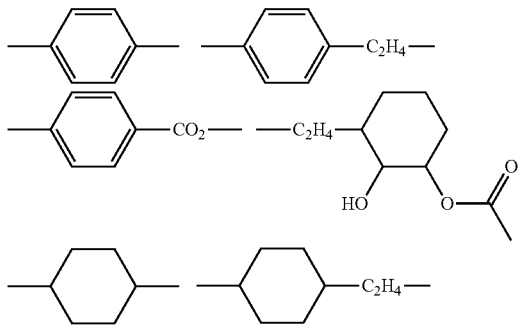

Specific examples of the organosilane compound represented by the general formulae (7) to (9) described above include:
3-trimethoxysilylpropylsuccinic anhydride, 3-triethoxysilylpropylsuccinic anhydride,
3-triphenoxysilylpropylsuccinic anhydride, 3-trimethoxysilylpropylphthalic anhydride, and 3-trimethoxysilylpropylcyclohexyl dicarboxylic anhydride.

These organosilane compounds may be used alone or in combination of two or more thereof.

In addition, a silane compound material other than those described above may be added. Such a silane compound has a silicon atom directly bound to a hydrolyzable group, such as an alkoxy group. Examples of trifunctional alkoxysilane compounds other than those described above include: methyltrimethoxysilane, methyltriethoxysilane, methyltripropoxysilane, methyltriisopropoxysilane, methyltributoxysilane, ethyltrimethoxysilane, ethyltriethoxysilane, hexyltrimethoxysilane, octadecyltrimethoxysilane, octadecyltriethoxysilane, phenyltrimethoxysilane, phenyltriethoxysilane, phenyltriisopropoxysilane, 1-naphthyltrimethoxysilane, 1-naphthyltriethoxysilane, 3-aminopropyltriethoxysilane, N-(2-aminoethyl)-3-aminopropyltrimethoxysilane, 3-chloropropyltrimethoxysilane, 3-(N,N-diglycidyl)aminopropyltrimethoxysilane, 3-glycidoxypropyltrimethoxysilane, vinyltrimethoxysilane, vinyltriethoxysilane, γ-methacryloxypropyltrimethoxysilane, γ-methacryloxypropyltriethoxysilane, γ-aminopropyltrimethoxysilane, γ-aminopropyltriethoxysilane, N-β-(aminoethyl)-γ-aminopropyltrimethoxysilane, β-cyanoethyltriethoxysilane, trifluoromethyltrimethoxysilane, trifluoromethyltriethoxysilane, trifluoropropyltrimethoxysilane, trifluoropropyltriethoxysilane, perfluoropropylethyltrimethoxysilane, perfluoropropylethyltriethoxysilane, perfluoropentylethyltrimethoxysilane, perfluoropentylethyltriethoxysilane, tridecafluorooctyltrimethoxysilane, tridecafluorooctyltriethoxysilane, tridecafluorooctyltripropoxysilane, tridecafluorooctyltriisopropoxysilane, heptadecafluorodecyltrimethoxysilane, and heptadecafluorodecyltriethoxysilane.

Examples of bifunctional alkoxysilane compounds include: dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, γ-glycidoxypropylmethyldimethoxysilane, γ-aminopropylmethyldimethoxysilane, γ-aminopropylmethyldiethoxysilane, N-(2-aminoethyl)-3-aminopropylmethyldimethoxysilane, γ-methacryloxypropylmethyldimethoxysilane, γ-methacryloxypropylmethyldiethoxysilane, trifluoropropylmethyldimethoxysilane, trifluoropropylmethyldiethoxysilane, trifluoropropylethyldimethoxysilane, trifluoropropylethyldiethoxysilane, trifluoropropylvinyldimethoxysilane, trifluoropropylvinyldiethoxysilane, heptadecafluorodecylmethyldimethoxysilane, 3-chloropropylmethyldimethoxysilane, 3-chloropropylmethyldiethoxysilane, cyclohexylmethyldimethoxysilane, and octadecylmethyldimethoxysilane.

Among the trifunctional alkoxysilane compounds, preferred are methyltrimethoxysilane, methyltriethoxysilane, phenyltrimethoxysilane, and phenyltriethoxysilane from the viewpoint of the chemical resistance of the cured film to be obtained.

Among the bifunctional alkoxysilane compounds, preferably used is dimethyldialkoxysilane so that the obtained cured film has flexibility.

In addition to them, examples of tetrafunctional alkoxysilane compounds include tetramethoxysilane and tetraethoxysilane.

These alkoxysilane compounds may be used alone or in combination of two or more thereof.

The amount of a hydrolyzed and condensed product from alkoxysilane compounds, i.e., siloxane compound is preferably 10% by mass or more, more preferably 20% by mass or more, relative to the total solid content of the resin composition excluding solvents. Further, the amount is preferably 80% by mass or less. When the composition contains a siloxane compound in an amount within this range, the cured film has improved light transmittance and crack resistance.

Polysiloxane in the present invention can be obtained by hydrolyzing and condensing alkoxysilane compound materials.

In the hydrolysis reaction, to an alkoxysilane compound as described above are added an acid catalyst and water in a solvent to produce a silanol group. Preferably, after adding an acid catalyst and water to an alkoxysilane compound over 1 to 180 minutes, the mixture is reacted at a temperature from room temperature to 110° C. for 1 to 180 minutes. By performing a hydrolysis reaction under such conditions, rapid reaction can be prevented. The reaction temperature is more preferably from 40 to 105° C.

After the hydrolysis reaction, a condensation reaction is carried out to obtain polysiloxane according to the present invention. The condensation reaction is preferably carried out by heating the reaction solution at a temperature at least 50° C. lower than the boiling point of the solvent for 1 to 100 hours. Re-heating or addition of base catalyst is also useful for increased degree of polymerization of the polysiloxane compound to be obtained by the condensation reaction.

By setting various conditions in the hydrolysis and condensation reactions, such as acid concentration, reaction temperature, and reaction time, taking into account the reaction scale, and the size and the shape of the reaction vessel, physical properties suitable for the intended use can be obtained.

The acidic catalyst used in the hydrolysis reaction may be hydrochloric acid, acetic acid, formic acid, nitric acid, oxalic acid, hydrochloric acid, sulfuric acid, phosphoric acid, polyphosphoric acid, polyvalent carboxylic acid, or an anhydride thereof, or an ion exchange resin. An acidic aqueous solution using formic acid, acetic acid, or phosphoric acid is particularly preferred.

The amount of the acid catalyst is preferably 0.05 parts by mass or more, more preferably 0.1 parts by mass or more, relative to 100 parts by mass of the entire polysiloxane compound before the hydrolysis reaction. The amount is also preferably 10 parts by mass or less, more preferably 5 parts by mass or less. The amount of the entire polysiloxane compound means the total amount of an alkoxysilane compound having a silicon atom as a source of polysiloxane, a hydrolysate thereof, and a condensate thereof as polysiloxane. This definition shall apply hereinafter. When the amount of the acid catalyst is 0.05 parts by mass or more, the hydrolysis reaction smoothly proceeds. Furthermore, when the amount is 10 parts by mass or less, the hydrolysis reaction is easily controlled.

The solvent used in the hydrolysis and condensation reactions is not particularly restricted, and is selected, as appropriate, according to the stability, wettability, volatility, and the like of the resin composition. One or two or more solvents can be used. Specific examples of the solvent include:

- alcohols, such as methanol, ethanol, propanol, isopropanol, butanol, isobutanol, t-butanol, pentanol, 4-methyl-2-pentanol, 3-methyl-2-butanol, 3-methyl-3-methoxy-1-butanol, diacetone alcohol;
- glycols, such as ethylene glycol and propylene glycol; ethers, such as ethylene glycol monomethyl ether, ethylene glycol monoethyl ether, propylene glycol monomethyl ether, propylene glycol monoethyl ether, propylene glycol monopropyl ether, propylene glycol monobutyl ether, propylene glycol mono-t-butyl ether, ethylene glycol dimethyl ether, ethylene glycol diethyl ether, ethylene glycol dibutyl ether, and diethyl ether;
- ketones, such as methyl ethyl ketone, acetylacetone, methyl propyl ketone, methyl butyl ketone, methyl isobutyl ketone, diisobutyl ketone, cyclopentanone, and 2-heptanone;
- amides, such as dimethylformamide and dimethylacetamide; acetates, such as ethyl acetate, propyl acetate, butyl acetate, isobutyl acetate, ethylene glycol monoethyl ether acetate, propylene glycol monomethyl ether acetate, 3-methoxybutyl acetate, 3-methyl-3-methoxybutyl acetate, methyl lactate, ethyl lactate, and butyl lactate;
- aromatic or aliphatic hydrocarbons, such as toluene, xylene, hexane, and cyclohexane; and
- others, such as γ-butyrolactone, N-methyl-2-pyrrolidone, and dimethyl sulfoxide.

Among them, preferably used are, for example, propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, and γ-butyrolactone, from the viewpoint of the transmittance, crack resistance, and the like of the cured film.

Preferably, after completion of the hydrolysis and condensation reactions, additional solvent can be added to adjust the concentration or viscosity into an appropriate value as that of the resin composition. In addition, after the hydrolysis reaction, all or part of volatile hydrolysates, such as alcohol, produced by heating and/or vacuum can be distilled and removed, followed by addition of a suitable solvent.

The amount of the solvent used in the hydrolysis reaction preferably 50 parts by mass or more, more preferably 80 parts by mass or more, and is preferably 500 parts by mass or less, more preferably 200 parts by mass or less, relative to 100 parts by mass of the entire polysiloxane compound. When the amount of the solvent is 50 parts by mass or more, gel production can be reduced. When the amount is 500 parts by mass or less, the hydrolysis reaction proceeds rapidly.

Preferably, water used in the hydrolysis reaction is ion exchanged water. The amount of water can be selected as needed, and water is preferably used in an amount ranging from 1.0 to 4.0 moles per 1 mole of the alkoxysilane compound.

<Metallic Compound Particles (D)>

The resin composition of the present invention may further contain metallic compound particles (D). The metallic compound particles (D) may be, for example, one or more metallic compound particles selected from aluminum compound particles, tin compound particles, titanium compound particles, and zirconium compound particles, or composite particles of one or more metallic compounds selected from an aluminum compound, a tin compound, a titanium compound, and a zirconium compound with a silicon compound.

Among them, the resin composition preferably contains at least any one of titanium oxide particles and zirconium oxide particles. The inclusion of these particles allows for adjustment of the refractive index within a desired range. In addition, the cured film can have improved hardness, abrasion resistance, and cracking resistance.

Preferably, the number average particle diameter of the metallic compound particles (D) is from 1 to 200 nm. In order to obtain a cured film having high transmittance, the number average particle diameter is more preferably from 1 nm to 70 nm. The number average particle diameter of the metallic compound particles can be measured by a gas adsorption method, a dynamic light scattering method, a small angle X-ray scattering method, a transmission electron microscopy, or a scanning electron microscopy.

Titanium oxide particles and zirconium oxide particles can be selected as appropriate according to the intended use. For example, in order to obtain a cured film having high refractive index, titanium compound particles such as titanium oxide particles, or zirconium compound particles such as zirconium oxide particle are preferably used. The amount of the metallic compound particles (D) is preferably from 40 to 70% by mass relative to the solid content in the resin composition. The lower limit is more preferably 45% by mass or more, still more preferably 50% by mass or more. The upper limit is more preferably 65% by mass or less, still more preferably 60% by mass or less. When the amount is less than 40% by mass, the refractive index decreases and the light condensing efficiency decreases. When the amount is over 70% by mass, the polysiloxane component is reduced, resulting in poor resolution during pattern processing.

Titanium oxide include, for example, anatase titanium oxide and rutile titanium oxide having different crystal structures. The metallic compound particles (D) may have any crystal structure. Metallic compound particles (D) having a structure suitable for the intended use can be used.

The surface of the metallic compound particles (D) may be covered with a polymer, a dispersing agent, or the like. This is because the metallic compound particles (D) with its surface covered has a stable dispersion state and thus are less likely to aggregate or precipitate even when the amount of the metallic compound particles (D) in the resin composition is increased.

Any polymer or dispersing agent may be used to cover the surface of the metallic compound particles (D). Polysiloxane (A) also contributes to the dispersion stabilization of the metallic compound particles (D). Polysiloxane (A) and the metallic compound particles (D) can easily interact with each other and can be simply mixed to achieve the dispersion stabilization effect. By mixing them during hydrolysis and condensation reactions of polysiloxane (A), polysiloxane (A) and the metallic compound particles (D) can be homogenized and the dispersion stability can be further improved.

Further, metallic compound particles (D) may be mixed during the hydrolysis reaction of alkoxy silane. This allows polysiloxane (A) and metallic compound particles (D) to have a good mixed state, resulting in improved stability of the resin composition.

Examples of commercially available metallic compound particles include silicon oxide-titanium oxide composite particles, "OPTOLAKE" (registered trademark) TR-502, "OPTOLAKE" TR-503, "OPTOLAKE" TR-504, "OPTOLAKE" TR-513, "OPTOLAKE" TR-520, "OPTOLAKE" TR-527, "OPTOLAKE" TR-528, "OPTOLAKE" TR-529, and "OPTOLAKE" TR-550, and titanium oxide particles, "OPTOLAKE" TR-505 (product name, all of which are produced by Catalysts and Chemicals Industries Co., Ltd.), zirconium oxide particles (produced by Kojundo Chemical Lab. Co., Ltd.), and tin oxide-zirconium oxide composite particles (produced by Catalysts and Chemicals Industry Co., Ltd.).

The amount of the metallic compound particles is not particularly limited, and can be an appropriate amount for the intended use, generally about 1 to 70% by mass in the solid content of the siloxane resin composition.

<Naphthoquinonediazide Compound (B)>

In order to impart the siloxane resin composition of the present invention with positive photosensitivity, a naphthoquinonediazide compound (B) is used. Use of naphthoquinonediazide compound allows for dissolution of the exposed portion with an aqueous tetramethylammonium hydroxide solution, resulting in a positive relief pattern.

Preferred quinonediazide photosensitizer is a compound represented by either of the following general formulae (10). The compound is yielded by esterification of a compound having a phenolic hydroxy group with sulfonic acid of naphthoquinonediazide.

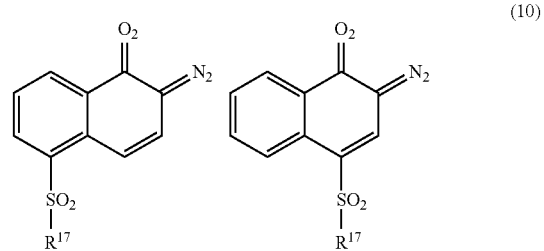

(10)

In the formula above, $R^{17}$ represents an esterified structure of a compound having a phenolic hydroxy group. Examples of the compound having a phenolic hydroxy group used herein include 4,4'-Cyclohexylidenobisphenol, 4,4'-Cyclohexylidenebis[2-methylphenol], 5,5'-(1,1'-Cyclohexylidene)bis-[1,1'-(biphenyl)-2-ol], 4,4'-Cyclopentylidenebisphenol, 4,4'-Cyclohexylidenebis[2,6-dimethylphenol], 4,4'-Cyclohexylidenebis[2-(1,1-dimethylethyl)phenol], 4,4'-Cyclohexylidenebis[2-cyclohexylphenol], 4,4'-Cyclopentylidenebis[2-methylphenol], 4,4'-(4-Methylcyclohexylidene)bisphenol 4,4'-Cyclopentylidenebis[2,6-dimethylphenol], 4,4'-[4-(1-Methylethyl)cyclohexylidene]bisphenol, 4,4'-[4-(1-methylethyl)cyclohexylidene]bis[2-methylphenol], 4,4'-[4-(1-Methylethyl)cycrohexylidene]bis[2-cycrohexylphenol], 4,4'-Cyclopentylidenebis[2-(1-methylethylphenol], 4,4'-[4-(1-Methylethyl)cyclohexylidene]bis[2,6-dimethylphenol], 4,4'-Cyclopentylidenebis[2-(1,1-dimethylethyl)phenol], 4,4,4',4'Tetrakis[(1-methylethylidene)bis(1,4-cyclohexylidene)]phenol), 4,4',4"-Ethylidenetrisphenol, 4,4'-[1-[4-[1-(4-Hydroxyphenyl)-1-methylethyl]phenyl]ethylidene]bisphenol, Cyclohexylidenebis[2-fluorophenol], 4,6-Bis[(4-hydroxyphenyl)methyl]-1,3-benzenediol, 4,6-Bis[(3,5-dimethyl-4-hydroxyphenyl)methyl]-1,2,3-benzenetriol, 2,4,6-Tris(4-hydroxyphenylmethyl)-1,3-benzenediol, 2,4-Bis[(3-methyl-4-hydroxypheny)methyl]-6-cyclohexylphenol, 2,4-Bis[(5-methyl-2-hydoxypheny)methyl]-6-cyclohexylphenol, 2,4-Bis[(2,5-dimethyl-4-hydroxypheny)methyl]-6-cyclohexylphenol, 2,4-Bis[(3,5-dimethyl-4-hydroxypheny)methyl]-6-cyclohexylphenol, 2,4-Bis[(4-hydroxy-3-cyclohexylpheny)methyl]-6-methylphenol, 2,4-Bis[(2,3,6-trimethyl-4-hydroxypheny)methyl]-6-cycrohexylphenol, 4,6-Bis[3,5-dimethyl-4-hydroxyphenyl]methyl]-1,3-benzenediol, 2,4-Bis[(2,4-dihydroxypheny)methyl]-6-cyclohexylphenol, and 4-[1-(4-Hydroxyphenyl)-1-phenylethyl]-1,2-benzenediol; BIR-OC, BIP-PC, 2,6-Bis(2,4-dihydroxybenzyl)-4-methylphenol, BIR-PTBP, BIR-PCHP, BIP-BIOC-F, 4PC, BIR-BIPC-F, TEP-BIP-A (all of which are: product name, produced by Asahi Yukizai Corporation); 4,4'-sulfonyldiphenol (produced by Wako Pure Chemicals), 9,9-Bis(4-hydroxyphenyl)fluorene (product name, produced by JFE Chemical Corporation).

Among them, preferred compounds having a phenolic hydroxy group include: 4,4'-Cyclohexylidenobisphenol, 4,4,4',4'Tetrakis[(1-methylethylidene)bis(1,4-cyclohexylidene)]phenol, 4,4',4"-Ethylidenetrisphenol, 4,4'-[1-[4-[1-(4-Hydroxyphenyl)-1-methylethyl]phenyl]ethylidene]bisphenol, 4,4'-Cyclohexylidenebis[2-cyclohexylphenol], 4,4'-(4-Methylcyclohexylidene)bisphenol, 4,4'-[4-(1-Methylethyl)cyclohexylidene]bisphenol, 4,4'-[4-(1-Methylethyl)cycrohexylidene]bis[2-cycrohexylphenol], 4,4'-Cyclopentylidenebis phenol, 4,6-Bis[(4-hydroxyphenyl)methyl]-1,3-benzenediol, 2,4,6-Tris(4-hydroxyphenylmethyl)-1,3-benzenediol, 2,4-Bis[(5-methyl-2-hydoxypheny)methyl]-6-cyclohexylphenol, 4,6-Bis[3,5-dimethyl-4-hydroxyphenyl]

methyl]-1,3-benzenediol, 4-[1-(4-Hydroxyphenyl)-1-phenylethyl]-1,2-benzenediol, BIP-PC, 2,6-Bis(2,4-dihydroxybenzyl)-4-methylphenol, BIR-PTBP, BIR-BIPC-F, and 9,9-Bis(4-hydroxyphenyl)fluorene.

Among them, particularly preferred compounds having a phenolic hydroxy group include, for example, 4,4'-Cyclohexylidenebisphenol, 4,4,4',4'Tetrakis[(1-methylethylidene)bis(1,4-cyclohexylidene)]phenol, 4,4',4"-Ethylidenetrisphenol, 4,4'-[1-[4-[1-(4-Hydroxyphenyl)-1-methylethyl]phenyl]ethylidene]bisphenol, 4,6-Bis[(4-hydroxypheny)methyl]-1,3-benzenediol, 2,4,6-Tris(4-hydroxyphenylmethyl)-1,3-benzenediol, 4-[1-(4-Hydroxyphenyl)-1-phenylethyl]-1,2-benzenediol, 2,6-Bis(2,4-dihydroxybenzyl)-4-methylphenol, BIR-PTBP, BIR-BIPC-F, 4,4'-sulfonyldiphenol, and 9,9-Bis(4-hydroxyphenyl)fluorene.

Preferred examples may include those obtained by introducing 4-naphthoquinonediazide sulfonate or 5-naphthoquinonediazide sulfonate to the compounds having a phenolic hydroxy group described above via an ester bond. Other compounds can be used.

The amount of the naphthoquinonediazide compound (B) is preferably from 1 to 50 parts by mass, more preferably from 2 to 10 parts by mass, relative to 100 parts by mass of the polysiloxane compound (A). When the amount is 1 part by mass or more, pattern formation can be made with practical sensitivity. When the amount is 50 parts by mass or less, a resin composition with excellent transmittance and pattern resolution can be obtained.

The molecular weight of the naphthoquinonediazide compound is preferably 300 or more, more preferably 350 or more. The molecular weight is also preferably 1,000 or less, more preferably 800 or less. When the molecular weight is 300 or more, an effect of reducing dissolution of unexposed portions can be obtained. When the molecular weight is 1,000 or less, a portion after exposure, development, and removal of the photosensitive resin composition can exhibit a relief pattern without scum.

Addition of a naphthoquinonediazide compound may cause residual naphthoquinonediazide groups in the unexposed portion of the coating film, which in turn may cause coloring of the film after heating and curing. Preferably, in order to obtain a transparent cured film, the whole film after development is irradiated with ultraviolet light, the naphthoquinonediazide compound is degraded, and then the film is heated and cured.

<Solvent (C)>

The resin composition of the present invention comprises a solvent (C). Preferred examples of the solvent (C) used in the resin composition of the present invention include:
ether compounds, such as ethylene glycol monomethyl ether, ethylene glycol monoethyl ether, propylene glycol monomethyl ether, propylene glycol monoethyl ether, propylene glycol monopropyl ether, propylene glycol monobutyl ether, propylene glycol mono-t-butyl ether, ethylene glycol dimethyl ether, ethylene glycol diethyl ether, ethylene glycol dibutyl ether;
acetate compounds, such as ethylene glycol monoethyl ether acetate, propylene glycol monomethyl ether acetate, propyl acetate, butyl acetate, isobutyl acetate, 3-methoxybutyl acetate, and 3-methyl-3-methoxybutyl acetate;
lactates, such as methyl lactate, ethyl lactate, and butyl lactate;
ketone compounds, such as acetylacetone, methyl propyl ketone, methyl butyl ketone, methyl isobutyl ketone, cyclopentanone, 2-heptanone, and mesityl oxide;
alcohol compounds, such as methanol, ethanol, propanol, butanol, isobutyl alcohol, pentanol, 4-methyl-2-pentanol, 3-methyl-2-butanol, 3-methyl-3-methoxy-1-butanol, and diacetone alcohol;
aromatic hydrocarbon compounds, such as toluene and xylene; and others, such as γ-butyrolactone and N-methylpyrrolidinone.

These may be used alone or in combination.

Among them, particularly preferred solvents are, for example, propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, diacetone alcohol, and γ-butyrolactone. These may be used alone or in combination of two or more thereof.

The total content of the solvents in the resin composition of the present invention preferably ranges from 100 parts by mass to 9,900 parts by mass, more preferably from 100 parts by mass to 5,000 parts by mass, relative to 100 parts by mass of the polysiloxane compound.

<Other Components>

The resin composition of the present invention may contain various surfactants in order to improve the flow properties and film thickness uniformity during its application. The types of the surfactants are not particularly restricted and, for example, fluorine surfactants, silicone surfactants, polyalkylene oxide surfactants, and poly(meth)acrylate surfactants can be used. Among them, fluorine surfactants are particularly preferably used from the viewpoint of flow properties and film thickness uniformity.

Specific examples of fluorine surfactants include fluorine surfactants containing a compound having at least a fluoroalkyl or fluoroalkylene group at any site of its end, main chain, and side chain, such as 1,1,2,2-tetrafluorooctyl(1,1,2,2-tetrafluoropropyl) ether, 1,1,2,2-tetrafluorooctyl hexyl ether, octaethylene glycol di(1,1,2,2-tetrafluorobutyl) ether, hexaethylene glycol (1,1,2,2,3,3-hexafluoropentyl) ether, octapropylene glycol di(1,1,2,2-tetrafluorobutyl) ether, hexapropylene glycol di(1,1,2,2,3,3-hexafluoropentyl) ether, sodium perfluorododecylsulfonate, 1,1,2,2,8,8,9,9,10,10-decafluorododecane, 1,1,2,2,3,3-hexafluorodecane, N-[3-(perfluorooctanesulfonamide)propyl]-N,N-dimethyl-N-carboxymethylene ammonium betaine, perfluoroalkylsulfonamide propyltrimethylammonium salt, perfluoroalkyl-N-ethylsulfonylglycine salt, bis(N-perfluorooctylsulfonyl-N-ethylaminoethyl) phosphate, and monoperfluoroalkylethyl phosphate.

Commercially available fluorine surfactants include "MEGAFACs" (registered trademark) F142D, F172, F173, F183, F410, F477, F553, F554, F556, F557, F559, F560, F563, RS-72-K, DS-21, and R-41 (all of which are produced by Dainippon Ink and Chemicals, Inc.), "EFTOPs" (registered trademark) EF301, EF303, and EF352 (produced by Shin Akita Chemical Corp.), "FLUORADs" FC-430 and FC-431 (produced by Sumitomo 3M Limited), "Asahi-Guard" (registered trademark) AG710, "SURFLONs" (registered trademark) S-382, SC-101, SC-102, SC-103, SC-104, SC-105, and SC-106 (Asahi Glass Co., Ltd.), "BM-1000", "BM-1100" (produced by Yusho Co., Ltd.), "NBX-15", and "FTX-218" (produced by NEOS Company Limited). Among them, "MEGAFACs" (registered trademark) F477, F556, and F563, "BM-1000", "BM-1100", "NBX-15", and "FTX-218" described above are particularly preferred from the viewpoint of flow properties and film thickness uniformity.

Commercially available silicone surfactants include "SH28PA", "SH7PA", "SH21PA", "SH30PA", and "ST94PA" (all of which are produced by Dow Corning Toray Silicone Co., Ltd.), "BYK-333" and "BYK-352" (produced by BYK-Chemie Japan K.K.), and "KL-700", "LE-302", "LE-303", and "LE-304" (produced by Kyoeisha Chemical Co., Ltd.). Examples of other surfactants include polyoxyethylene lauryl ether, polyoxyethylene stearyl ether, polyoxyethylene nonylphenyl ether, and polyoxyethylene distearate.

The amount of the surfactant is usually from 0.001 to 10 parts by mass relative to 100 parts by mass of the total content of polysiloxane compounds in the resin composition. These may be used alone or in combination of two or more thereof.

In addition, the positive photosensitive resin composition of the present invention may contain a polymerization inhibitor in order to, for example, reduce thermal polymerization during prebaking for evaporating the solvent. The polymerization inhibitor may be, for example, a catechol, an alkylphenol, or an alkylbisphenol such as phenol, hydroquinone, p-methoxyphenol, benzoquinone, methoxybenzoquinone, 1,2-naphthoquinone, cresol, p-t-butylcatechol ( ), phenothiazine, 2,5-di-t-butylhydroquinone, 2,6-di-t-butylphenol, octadecyl-3-(3,5-di-t-butyl-4-hydroxyphenyl) propionate, N,N'-hexamethylenebis(3,5-di-t-butyl-4-hydroxy-hydrocinnamamide), 2,2'methylenebis(4-methyl-6-t-butylphenol), 4,4'methylenebis(2,6-di-t-butylphenol), 4,4'butylidenebis(3-methyl-6-t-butylphenol), 2,6-bis(2'-hydroxy-3'-t-butyl-5'-methylbenzyl)4-methylphenol, 1,1,3-tris(2'-methyl-5'-t-butyl-4'-hydroxyphenyl)butane, 1,3,5-trimethyl-2,4,6-tris(3'-5'-di-t-butyl-4'-hydroxybenzyl)benzene, triethylene glycol bis[3-(3-t-butyl-5-methyl-4-hydroxyphenyl)propionate], pentaerythrityl tetrakis[3-(3,5-di-t-butyl-4-hydroxyphenyl)propionate], 2-t-butyl-6-(3-t-butyl-2-hydroxy-5-methylbenzyl)-4-methylphenylacrylate, 2,4-dimethyl-6-t-butylphenol, or 2-t-butyl-4-methoxyphenol (phenol), 6-t-butyl-m-cresol, 2,6-di-t-butyl-p-cresol, 2-t-butylhydroquinone, methylene blue, copper dimethyldithiocarbamate salt, copper diethyldithiocarbamate salt, copper dipropyldithiocarbamate salt, copper dibutyldithiocarbamate salt, copper dibutyldithiocarbamate, copper salicylate, thiodipropionate ester, mercaptobenzimidazole, or phosphite, or a combination thereof with oxygen-containing gas such as such as air. The amount of the polymerization inhibitor in the positive photosensitive resin composition of the present invention is preferably from 0.000005 to 0.2% by mass, more preferably from 0.00005 to 0.1%, relative to the entire positive photosensitive resin composition. Also, the amount is preferably from 0.0001 to 0.5% by mass, more preferably from 0.001 to 0.2% by mass, relative to all components other than organic solvents. The resin composition of the present invention can further contain, as necessary, for example, a viscosity modifier, a stabilizing agent, a coloring agent, and an ultraviolet absorber.

<Method of Producing Cured Films>

The resin composition of the present invention is applied onto a substrate to obtain a coating film. The coating film can be dried and cured by heating to form a cured film.

Methods for applying a resin composition that can be preferably used in the present invention include microgravure coating, spin coating, dip coating, curtain flow coating, roll coating, spray coating, slit coating, and flow coating methods.

Heat drying and curing conditions are selected, as appropriate, according to the substrate and the resin composition employed. The operation is preferably carried out usually at room temperature or higher and 400° C. or lower for 0.5 minutes to 240 minutes. In particular, the curing temperature is preferably from 100 to 400° C., more preferably from 150 to 400° C.

The film thicknesses of the coating film and the cured film are not particularly limited, and both range generally from 0.001 to 100 μm.

In a preferred embodiment of the present invention, the method of producing a cured film comprises the following steps:

(I) applying the positive photosensitive resin composition as described above on a substrate to form a coating film;

(II) exposing the coating film to light; and (III) heating the exposed coating film.

The above-described steps are described in order.

(I) Step of Applying Positive Photosensitive Resin Composition on Substrate to Form Coating Film The resin composition as described above is applied onto a substrate by a known method, such as spin coating or slit coating, and heated using a heating apparatus, such as a hot plate or oven. This heating is called prebaking. Prebaking is preferably performed at a temperature ranging from 50 to 150° C. for 30 seconds to 30 minutes. The film thickness after prebaking is preferably from 0.1 to 15 μm.

(II) Step of Exposing Coating Film to Light

After prebaking, the entire coating film is exposed to light using an UV-visible light exposure, such as a stepper, a mirror projection mask aligner (MPA), or a parallel light mask aligner (PLA), at an exposure amount of about 10 to 4,000 J/m$^2$ (equivalent in exposure amount at a wavelength of 365 nm).

(III) Step of Curing Coating Film by Heating

The coating film after the step (I) or after the steps (I) and (II) is heated (cured) using a heating apparatus, such as a hot plate or an oven, at a temperature ranging from 150 to 450° C. for about 30 seconds to 2 hours to obtain a cured film.

In the case where a cured film is produced after pattern processing with the resin composition, the method preferably includes the following steps.

(i) applying the positive photosensitive resin composition as described above on a substrate to form a coating film;

(ii) subjecting the coating film to a pattern exposure step followed by a development step using a developer to remove exposed portion of the coating film;

(iii) exposing the remaining coating film after the development step; and (iv) heating the exposed coating film.

The above-described steps are described in order.

(i) Step of Applying Positive Photosensitive Resin Composition on Substrate to Form Coating Film The resin composition as described above is applied onto a substrate by a known method, such as spin coating or slit coating, and heated using a heating apparatus, such as a hot plate or oven. This heating is called prebaking. Prebaking is preferably performed at a temperature ranging from 50 to 150° C. for 30 seconds to 30 minutes. The film thickness after prebaking is preferably from 0.1 to 15 μm.

(ii) Step of Subjecting Coating Film to Pattern Exposure Step followed by Development Step using Developer to Remove Exposed Portion of Coating Film After prebaking, pattern exposure to light is performed using an UV-visible light exposure, such as a stepper, a mirror projection mask aligner (MPA), or a parallel light mask aligner (pla), via a desired mask, at an exposure amount of about 10 to 4,000 J/m$^2$ (equivalent in exposure amount at a wavelength of 365 nm).

After exposure, development is performed to dissolve and remove the exposed portion of the film, thereby obtaining a positive pattern. Preferably, the pattern resolution is 15 μm or less. The development method may be, for example, a showering, dipping, or paddling method. The film is preferably immersed in a developer for 5 seconds to 10 minutes. Known alkali developers can be used as the developer, including aqueous solutions of the following alkali components: inorganic alkali components such as hydroxide, carbonate, phosphate, silicate, and borate of alkali metals, 2-diethylaminoethanol, amines such as monoethanolamine and diethanolamine, tetramethylammonium hydroxide (TMAH), and quaternary ammonium salts such as choline. Two or more of them may be used as alkali developers.

After development, the film is preferably rinsed with water. If needed, baking for dehydration and drying may be performed using a heating apparatus, such as a hot plate or an oven, at a temperature ranging from 50 to 150° C. Further, if needed, heating is performed using a heating apparatus, such as a hot plate or an oven, at a temperature ranging from 50 to 300° C. for 30 seconds to 30 minutes. This process is called soft baking.

(iii) Step of Exposing Remaining Coating Film after Development Step

After development, pattern exposure to light is performed using an UV-visible light exposure, such as a stepper, a mirror projection mask aligner (mpa), or a parallel light mask aligner (pla), via a desired mask, at an exposure amount of about 10 to 4,000 J/m$^2$ (equivalent in exposure amount at a wavelength of 365 nm).

(iv) Step of Heating Exposed Coating Film

The coating film after the step (III) is heated (cured) using a heating apparatus, such as a hot plate or an oven, at a temperature ranging from 150 to 450° C. for about 30 seconds to 2 hours to obtain a cured film.

According to one embodiment of the present invention, the resin composition exhibits a sensitivity in exposure in the step of exposure and development (II) of preferably 1,500 J/m$^2$ or less, more preferably 1,000 J/m$^2$ or less, from the viewpoint of productivity in pattern formation. Such high sensitivity can be achieved with a photosensitive resin composition containing polysiloxane that is obtained by using an organosilane compound having a styryl group and/or a (meth)acryloyl group.

The sensitivity in exposure can be obtained by the following method. The photosensitive resin composition is spin-coated on a silicon wafer using a spin coater at a desired rotation speed. The coating film was prebaked using a hot plate at 120° C. for 3 minutes to prepare a prebaked film having a film thickness of 1 μm. Using a mask aligner PLA (PLA-501F produced by Canon Inc.), the prebaked film is exposed to light from an ultra-high pressure mercury lamp through a gray scale mask having 1 to 10 μm line-and-space pattern for sensitivity measurement. Thereafter, using an automated development apparatus (AD-2000 produced by Takizawa Co., Ltd.), the film is subjected to shower development with 2.38% by weight of an aqueous solution of TMAH for 90 seconds, and then rinsed with water for 30 seconds. Among the exposure amounts by which, in the formed pattern, a square pattern with a designed dimension of 100 μm is formed and remains on the substrate without being peeled off after development, the lowest exposure amount (hereinafter referred to as optimum exposure amount) is defined as the sensitivity.

Then, as a heat curing step, the film was cured using a hot plate at 220° C. for 5 minutes to prepare a cured film, and the minimum pattern dimension in sensitivity is obtained as the post-curing resolution.

The resin composition of the present invention and the cured film therefrom are suitably used for optical devices, such as solid state image sensors, optical filters, and displays. More specifically, the resin composition of the present invention and the cured film therefrom are used in, for example, condensing microlenses and optical waveguides formed in solid state image sensors such as back-illuminated CMOS image sensors, antireflection coatings provided as optical filters, planarization materials for TFT substrates for displays, color filters and protective films therefor of liquid crystal displays, and phase shifters. Among them, the resin composition of the present invention and the cured film therefrom are particularly suitable for use as a condensing microlens formed on a solid state image sensor, or as an optical waveguide connecting a condensing microlens and an optical sensor because of their ability to achieve both high transparency and a high refractive index. They can also be used as buffer coats, interlayer insulating films, and various protective films for semiconductor devices. The photosensitive resin composition of the present invention does not require pattern formation by an etching method, which can simplify the work and avoid degradation of wirings by etching chemicals and plasma.

EXAMPLES

The present invention will be described in more detail below with reference to Examples, but is not limited thereto. Compounds that are used as abbreviations in Synthesis Examples and Examples are as shown below.

<Alkoxysilane Compounds>
MTMS: methyltrimethoxysilane
PhTMS: phenyltrimethoxysilane
StTMS: styryltrimethoxysilane
SuTMS: 3-trimethoxysilylpropylsuccinic anhydride
NaTMS: 1-naphthyltrimethoxysilane
VnTMS: vinyltrimethoxysilane <Solvents>
PGMEA: propylene glycol monomethyl ether acetate
DAA: diacetone alcohol
EDM: diethylene glycol ethyl methyl ether The measurement methods that were performed in Examples were as described below.

<Solid Content Concentration>

The solid content concentration in a polysiloxane solution was determined by the following method. First, 1.5 g of a polysiloxane solution was weighed into an aluminum cup, and heated on a hot plate at 250° C. for 30 minutes to evaporate the liquid content. The solid content left in the aluminum cup after heating was weighed, and the solid content concentration of the polysiloxane solution was determined.

<Determination of Ratio of Styryl and Vinyl Groups>

$^{29}$SI-NMR measurements were performed to determine the ratio of the integrated value of silicon atoms in various organosilanes to the integrated value of the total silicon atoms, and the ratio of the corresponding silicon atoms was calculated. Samples (liquid) that were used for measurement were injected into "Teflon" (registered trademark) NMR sample tubes having a diameter of 10 mm.

The measurement conditions in $^{29}$SI-NMR are shown below.

Machine: JNM GX-270 produced by JEOL Ltd.
Measurement method: gated decoupling method
Resonance frequency: 53.6693 MHz ($^{29}$Si nuclei)

Spectrum width: 20,000 Hz
Pulse width: 12 psec (45° pulse)
Pulse repeating time: 30.0 sec
Solvent: Acetone-d6
Reference material: tetramethylsilane
Measurement temperature: room temperature
Sample rotation speed: 0.0 Hz <Measurement of Refractive Index of Cured Film>

A spectroscopic ellipsometer, FE5000, produced by Otsuka Electronics Co., Ltd. was used to measure the refractive index of the obtained cured film at 22° C. at 633 nm.

<Evaluation of Heat Resistance of Cured Film>

The film thickness (T1) of the obtained cured film was measured. Next, the substrate with the cured film was further cured on a HP at 230° C. for 10 minutes, and the film thickness (T2) of the cured film was measured. The % change in the film thickness before and after the additional curing was calculated according to the following formula, and the % change in the film thickness was calculated according to the following formula.

$$\text{Change in Film Thickness (\%)} = (T1-T2)/T1 \times 100$$

The value was considered as an evaluation index for heat resistance. Lower values represent higher heat resistance.

<Evaluation of Light Resistance of Cured Film>

The film thickness (T1) of the obtained cured film was measured. Next, after keeping the substrate with the cured film under conditions at 0.5 W/m² at 340 nm at 45° C. for 72 hours on a xenon light resistance tester (Q-SUN Xenon Test Chamber-Model Xe-1), the film thickness (T3) of the cured film was measured and the % change in the film thickness was calculated according to the following formula.

$$\text{Change in Film Thickness(\%)} = (T1-T3)/T1 \times 100$$

The value was considered as an evaluation index for light resistance. Lower values represent higher light resistance.

<Evaluation of Resolution>

The obtained cured films were observed for their square patterns at all exposure amounts, and the pattern dimension (size of the square side) of the smallest square pattern with missing observed in the pattern was defined as resolution x. The evaluation criteria were defined as follows:

A: x<20 μm
B: 20 μm≤x<50 μm
C: 50 μm≤x.

<Evaluation of Development Residue>

The exposed portion of the pattern of the obtained cured film was dissolved by a development process, and evaluated based on the degree of dissolution residue of the exposed portion as follows:

A: No dissolution residue in visual observation and no residue even in micropatterns below 50 μm in microscopic observation;
B: No dissolution residue in visual observation and no residue in patterns over 50 μm, but residues are present in patterns below 50 μm in microscopic observation;
C: No dissolution residue in visual observation, but residues are present in patterns over 50 μm in microscopic observation;
D: Dissolution residues are present over the entire exposed portion in visual observation.

Polymers used in Examples were synthesized as described below.

Synthesis Example 1

Synthesis of Polysiloxane P-1

To a 500-mL three-necked flask were added 10.63 g (0.08 mol) of MTMS, 53.93 g (0.24 mol) of StTMS, 5.79 g (0.04 mol) of VnTMS, 10.24 g (0.04 mol) of SuTMS, and 98.35 g of DAA. To this, a mixture of 21.78 g of water and 0.40 g of phosphoric acid was added over 30 minutes at room temperature with stirring. Then, after the flask was placed in an oil bath at 70° C. with stirring for 1 hour, the oil bath was heated to 110° C. for 30 minutes. One hour after starting of temperature rise, the internal temperature of the solution reached 100° C., and the solution was heated with stirring for 2 hours. The temperature inside the flask was 100 to 110° C. During the reaction, 51 g in total of methanol and water were distilled as by-products. The solution of polysiloxane in DAA remaining in the flask was considered as a solution of polysiloxane P-1 in DAA. The solid content of the solution was 34.7%. The molar amount of styryl group in polysiloxane P-1 was 60 mol %, and the molar amount of vinyl group was 10 mol %, as measured by $^{29}$SI-NMR.

Synthesis Example 2

Synthesis of Polysiloxane P-2

In the same manner as in Synthesis Example 1, 13.34 g (0.1 mol) of MTMS, 52.71 g (0.23 mol) of StTMS, 2.9 g (0.02 mol) of VnTMS, 10.27 g (0.04 mol) of SuTMS, 98.25 g of DAA was added, followed by addition of a mixture of 21.85 g of water and 0.40 g of phosphoric acid, thereby synthesizing polysiloxane P-2. The solid content of the solution of polysiloxane P-2 in DAA was 34.7%. The molar amount of styryl group in polysiloxane P-2 was 60 mol %, and the molar amount of vinyl group was 5 mol %, as measured by $^{29}$SI-NMR.

Synthesis Example 3

Synthesis of Polysiloxane P-3

In the same manner as in Synthesis Example 1, 5.28 g (0.04 mol) of MTMS, 52.17 g (0.23 mol) of StTMS, 11.49 g (0.08 mol) of VnTMS, 10.17 g of SuTMS, 98.54 g of DAA was added, followed by addition of a mixture of 21.63 g of water and 0.40 g of phosphoric acid, thereby synthesizing polysiloxane P-3. The solid content of the solution of polysiloxane P-3 in DAA was 35.0%. The molar amount of styryl group in polysiloxane P-3 was 60 mol %, and the molar amount of vinyl group was 20 mol %, as measured by $^{29}$SI-NMR.

Synthesis Example 4

Synthesis of Polysiloxane P-4

In the same manner as in Synthesis Example 1, 2.63 g (0.02 mol) of MTMS, 51.99 g (0.23 mol) of StTMS, 14.32 g (0.1 mol) of VnTMS, 10.13 g of SuTMS, 98.64 g of DAA was added, followed by addition of a mixture of 21.56 g of water and 0.40 g of phosphoric acid, thereby synthesizing polysiloxane P-4. The solid content of the solution of polysiloxane P-4 in DAA was 35.3%. The molar amount of styryl group in polysiloxane P-4 was 60 mol %, and the molar amount of vinyl group was 25 mol %, as measured by $^{29}$SI-NMR.

Synthesis Example 5

Synthesis of Composite Compound BP-1 of Polysiloxane and Metallic Compound Particles In the same manner as in Synthesis Example 1, 3.35 g (0.02 mol) of MTMS, 16.56 g (0.07 mol) of StTMS, 1.82 g (0.01 mol) of VnTMS, 3.23 g (0.01 mol) of SuTMS, 99.05 g of TR-550, 68.90 g of DAA was added, followed by addition of a mixture of 6.87 g of water and 0.13 g of phosphoric acid, thereby synthesizing a composite compound BP-1 of polysiloxane and metallic compound particles. The solid content of the composite compound BP-1 of polysiloxane and metallic compound particles in DAA was 35.3%. The molar amount of styryl group in polysiloxane P-5 was 60 mol %, and the molar amount of vinyl group was 10 mol %, as measured by $^{29}$SI-NMR.

Polymers used in Comparative Example were synthesized as described below.

Synthesis Example 8

Synthesis of Polysiloxane R-3

To a 500-mL three-necked flask were added 19.3 g (0.13 mol) of VnTMS, 53.1 g (0.39 mol) of MTMS, 154.7 g (0.78 mol) of PhTMS, and 113.5 g of EDM. The mixture was heated to 60° C. for 30 minutes with stirring. To this, a mixture of 5.9 g of oxalic acid and 70.3 g of ion exchanged water was continuously added over 30 minutes, and the resulting mixture was then allowed to react at 60° C. for 3 hours. The reaction solution was placed under reduced pressure to remove methanol and water therefrom, followed by addition of EDM so that the solid content concentration was 35%, thereby synthesizing polysiloxane R-3. The solid content of the solution of polysiloxane R-3 in EDM was 35.2%. The molar amount of vinyl group in polysiloxane R-3 was 10 mol % as measured by 29SI-NMR.

TABLE 1

| | | alkoxysilane materials | | | | | | | | |
|---|---|---|---|---|---|---|---|---|---|---|
| No. | (A) | component a | content (mol %) | component b | content (mol %) | component c | content (mol %) | component d | content (mol %) | component e | content (mol %) |
| Synthesis Example 1 P-1 | StTMS | 60 | VnTMS | 10 | SuTMS | 10 | MTMS | 20 | | |
| Synthesis Example 2 P-2 | StTMS | 60 | VnTMS | 5 | SuTMS | 10 | MTMS | 25 | | |
| Synthesis Example 3 P-3 | StTMS | 60 | VnTMS | 20 | SuTMS | 10 | MTMS | 10 | | |
| Synthesis Example 4 P-4 | StTMS | 60 | VnTMS | 25 | SuTMS | 10 | MTMS | 5 | | |
| Synthesis Example 5 BP-1 | StTMS | 60 | VnTMS | 10 | SuTMS | 10 | MTMS | 20 | | |
| Synthesis Example 6 R-1 | | | | | SuTMS | 10 | MTMS | 40 | NaTMS | 50 |
| Synthesis Example 7 R-2 | StTMS | 50 | | | SuTMS | 10 | MTMS | 40 | | |
| Synthesis Example 8 R-3 | | | VnTMS | 10 | | | MTMS | 30 | PhTMS | 60 |

Synthesis Example 6

Synthesis of Polysiloxane R-1

To a 500-mL three-necked flask were added 21.06 g (0.15 mol) of MTMS, 48.0 g (0.19 mol) of NaTMS, 10.14 g (0.04 mol) of SuTMS, and 98.84 g of DAA. To this, a mixture of 21.57 g of water and 0.40 g of phosphoric acid was added over 30 minutes at room temperature with stirring. Then, after the flask was placed in an oil bath at 70° C. with stirring for 1 hour, the oil bath was heated to 110° C. for 30 minutes. One hour after starting of temperature rise, the internal temperature of the solution reached 100° C., and the solution was heated with stirring for 2 hours (the internal temperature was 100 to 110° C.). During the reaction, 48 g in total of methanol and water were distilled as by-products. The solution of polysiloxane in DAA remaining in the flask was considered as a solution of polysiloxane R-1 in DAA. The solid content of the solution was 35.2%.

Synthesis Example 7

Synthesis of Polysiloxane R-2

In the same manner as in Synthesis Example 6, 22.53 g (0.17 mol) of MTMS, 46.38 g (0.21 mol) of StTMS, 10.85 g (0.04 mol) of SuTMS, 96.52 g of DAA was added, followed by addition of a mixture of 23.08 g of water and 0.40 g of phosphoric acid, thereby synthesizing polysiloxane R-2. The solid content of the solution of polysiloxane R-2 in DAA was 35.3%. The molar amount of styryl group in polysiloxane R-2 was 50 mol % as measured by $^{29}$SI-NMR.

Solvent displacement of metallic compound particles was carried out as described below.

The solvent of "OPTOLAKE" TR-550 (produced by JGC Catalysts and Chemicals Ltd.) as metallic compound particles (D) was changed from methanol to DAA. To a 500-ml recovery flask were added 100 g of a methanol sol of "OPTOLAKE" TR-550 (solid content concentration: 20%) and 80 g of DAA, followed by removal of methanol under reduced pressure in an evaporator at 30° C. for 30 minutes. The solid content concentration of the obtained solution of TR-5550 in DAA <B-1> was measured to be 20.1%.

In the same manner, the solvent of "OPTOLAKE" TR-527 (produced by JGC Catalysts and Chemicals Ltd.) was changed from methanol to DAA. The solid content concentration of the obtained solution of TR-527 in DAA <B-2> was measured to be 20.3%.

Cured films were prepared as described below.

Application was performed onto an 8-inch silicon wafer substrate using a spin coater (produced by Tokyo Electron Limited, model name: CLEAN TRACK MARK 7). After application, the substrate was prebaked at 100° C. for 3 minutes, followed by pattern exposure using an I-line stepper exposure apparatus (produced by Nikon Corporation) at an exposure amount of 50 to 400 mJ/cm$^2$ (step by 50 mJ/cm$^2$). Thereafter, the substrate was subjected to shower development with 2.38 mass % aqueous tetramethylammonium hydroxide solution for 90 seconds before being rinsed with water for 30 seconds. The entire substrate was exposed using an I-line stepper exposure apparatus at an exposure amount of 400 mJ/cm$^2$. Finally, the resulting product was heated and cured at 230° C. for 5 minutes to obtain a cured film having a thickness of about 1 μm. The cured film was evaluated as described above.

Photosensitive resin compositions were prepared as described below.

Example 1

First, 7.64 g of the P-1 solution in DAA (35.3%) as polysiloxane (A), 0.3 g of THP-17 (sulfonate of 4,4',4"-Ethylidyne-trisphenol and 1,2-naphthoquinone-2-diazide-5-sulfonic acid) (produced by Daito Chemix Co., Ltd.) as a naphthoquinonediazide compound (B), and 1.40 g of PGMEA and 0.65 g of DAA as solvents (C) were mixed under yellow light. After shaking and stirring, the resulting mixture was filtered through a 0.45-μm filter to obtain a composition 1.

Example 2

First, 7.78 g of the P-2 solution in DAA (34.7%) as polysiloxane (A), 0.3 g of TDF-517 (sulfonate of 4,4',4"-Ethylidyne-trisphenol and 1,2-naphthoquinone-2-diazide-5-sulfonic acid) (produced by Toyo Gosei Co., Ltd.) as a naphthoquinonediazide compound (B), and 1.40 g of PGMEA and 0.52 g of DAA as solvents (C) were mixed under yellow light. After shaking and stirring, the resulting mixture was filtered through a 0.45-μm filter to obtain a composition 2.

Example 3

First, 7.71 g of the P-3 solution in DAA (35.0%) as polysiloxane (A), 0.3 g of TDF-517 (produced by Toyo Gosei Co., Ltd.) as a naphthoquinonediazide compound (B), and 1.40 g of PGMEA and 0.59 g of DAA as solvents (C) were mixed under yellow light. After shaking and stirring, the resulting mixture was filtered through a 0.45-μm filter to obtain a composition 3.

Example 4

First, 7.65 g of the P-4 solution in DAA (35.3%) as polysiloxane (A), 0.3 g of TDF-517 (produced by Toyo Gosei Co., Ltd.) as a naphthoquinonediazide compound (B), and 1.40 g of PGMEA and 0.65 g of DAA as solvents (C) were mixed under yellow light. After shaking and stirring, the resulting mixture was filtered through a 0.45-μm filter to obtain a composition 4.

Comparative Example 1

First, 7.67 g of the R-1 solution in DAA (35.2%) as polysiloxane (A), 0.3 g of TDF-517 (produced by Toyo Gosei Co., Ltd.) as a naphthoquinonediazide compound (B), and 1.40 g of PGMEA and 0.63 g of DAA as solvents (C) were mixed under yellow light. After shaking and stirring, the resulting mixture was filtered through a 0.45-μm filter to obtain a composition 5.

Comparative Example 2

First, 7.65 g of the R-2 solution in DAA (35.3%) as polysiloxane (A), 0.3 g of TDF-517 (produced by Toyo Gosei Co., Ltd.) as a naphthoquinonediazide compound (B), and 1.40 g of PGMEA and 0.65 g of DAA as solvents (C) were mixed under yellow light. After shaking and stirring, the resulting mixture was filtered through a 0.45-μm filter to obtain a composition 6.

Comparative Example 3

First, 7.65 g of the R-3 solution in DAA (35.2%) as polysiloxane (A), 0.3 g of TDF-517 (produced by Toyo Gosei Co., Ltd.) as a naphthoquinonediazide compound (B), and 2.05 g of EDM as a solvent (C) were mixed under yellow light. After shaking and stirring, the resulting mixture was filtered through a 0.45-μm filter to obtain a composition 7. The obtained compositions 1 to 7 were used to prepare cured films by the above-described method, which were evaluated for heat resistance, light resistance, resolution, and residue. Their compositions and evaluation results are shown in Tables 2 and 3.

TABLE 2

| | (I) resin composition | | | | | | | | |
|---|---|---|---|---|---|---|---|---|---|
| No. | resin composition name | poly-siloxane (A) | proportion (% by mass) | metallic compound particle (D) | proportion (% by mass) | naphthoquin-onediazide compound (B) | proportion (% by mass) | solvent (C) | proportion (% by mass) |
| Example 1 | composition 1 | P-1 | 27 | — | — | C-1 | 3 | PGMEA/DAA | 15/55 |
| Example 2 | composition 2 | P-2 | 27 | — | — | C-1 | 3 | PGMEA/DAA | 15/55 |
| Example 3 | composition 3 | P-3 | 27 | — | — | C-1 | 3 | PGMEA/DAA | 15/55 |
| Example 4 | composition 4 | P-4 | 27 | — | — | C-1 | 3 | PGMEA/DAA | 15/55 |
| Comparative Example 1 | composition 5 | R-1 | 27 | — | — | C-1 | 3 | PGMEA/DAA | 15/55 |
| Comparative Example 2 | composition 6 | R-2 | 27 | — | — | C-1 | 3 | PGMEA/DAA | 15/55 |
| Comparative Example 3 | composition 7 | R-3 | 30 | — | — | C-2 | 3 | EDM | 67 |

TABLE 3

| No. | heat resistance (%) | light resistance (%) | resolution | residue |
|---|---|---|---|---|
| Example 1 | 4.2% | 4.3% | A | A |
| Example 2 | 4.3% | 4.4% | A | A |
| Example 3 | 4.3% | 4.5% | A | B |
| Example 4 | 4.5% | 4.5% | A | B |
| Comparative Example 1 | 10.2% | 11.5% | A | A |
| Comparative Example 2 | 4.5% | 4.8% | C | D |

TABLE 3-continued

| No. | heat resistance (%) | light resistance (%) | resolution | residue |
|---|---|---|---|---|
| Comparative Example 3 | 3.5% | 10.9% | A | B |

Comparison was made between Examples 1 to 4 and Comparative Examples 1 to 3, demonstrating that the resin composition of the present invention showed good heat resistance and light resistance, as well as excellent developing properties.

Example 5

First, 2.83 g of the P-1 solution in DAA (35.3%) as polysiloxane (A), 0.25 g of TDF-517 (produced by Toyo Gosei Co., Ltd.) as a naphthoquinonediazide compound (B), 0.70 g of DAA as a solvent (C), and 6.22 g of the solution of TR-550 in DAA (B-1) as metallic compound particles (D) were mixed under yellow light. After shaking and stirring, the resulting mixture was filtered through a 0.45-μm filter to obtain a composition 8.

Example 6

First, 4.72 g of the P-1 solution in DAA (35.3%) as polysiloxane (A), 0.25 g of TDF-517 (produced by Toyo Gosei Co., Ltd.) as a naphthoquinonediazide compound (B), 2.13 g of DAA as a solvent (C), and 2.90 g of the solution of TR-550 in DAA (B-1) as metallic compound particles (D) were mixed under yellow light. After shaking and stirring, the resulting mixture was filtered through a 0.45-μm filter to obtain a composition 9.

Example 7

First, 3.54 g of the P-1 solution in DAA (35.3%) as polysiloxane (A), 0.25 g of TDF-517 (produced by Toyo Gosei Co., Ltd.) as a naphthoquinonediazide compound (B), 1.23 g of DAA as a solvent (C), and 4.98 g of the solution of TR-550 in DAA (B-1) as metallic compound particles (D) were mixed under yellow light. After shaking and stirring, the resulting mixture was filtered through a 0.45-μm filter to obtain a composition 10.

Example 8

First, 1.13 g of the P-1 solution in DAA (35.3%) as polysiloxane (A), 0.20 g of TDF-517 (produced by Toyo Gosei Co., Ltd.) as a naphthoquinonediazide compound (B), 1.70 g of DAA as a solvent (C), and 6.97 g of the solution of TR-550 in DAA (B-1) as metallic compound particles (D) were mixed under yellow light. After shaking and stirring, the resulting mixture was filtered through a 0.45-μm filter to obtain a composition 11.

Example 9

First, 0.57 g of the P-1 solution in DAA (35.3%) as polysiloxane (A), 0.20 g of TDF-517 (produced by Toyo Gosei Co., Ltd.) as a naphthoquinonediazide compound (B), 1.27 g of DAA as a solvent (C), and 7.96 g of the solution of TR-550 in DAA (B-1) as metallic compound particles (D) were mixed under yellow light. After shaking and stirring, the resulting mixture was filtered through a 0.45-μm filter to obtain a composition 12.

Example 10

First, 2.83 g of P-1 solution in DAA (35.3%) as polysiloxane (A), 0.25 g of SBF-525 (sulfonate of 4,4'-1-[4-[1-(4-Hydroxy-5-methylphenyl)methyl]-4-methylphenol and 1,2-naphthoquinone-2-diazide-5-sulfonic acid) (produced by AZ Electronic Materials S.A.) as a naphthoquinonediazide compound (B), 0.76 g of DAA as a solvent (C), and 6.16 g of the solution of TR-527 in DAA (B-2) as metallic compound particles (D) were mixed under yellow light. After shaking and stirring, the resulting mixture was filtered through a 0.45-μm filter to obtain a composition 13.

Example 11

First, 7.65 g of the BP-1 solution in DAA (35.3%) as a composite compound of polysiloxane (A) and metallic compound particle (D), 0.30 g of TDF-517 (produced by Toyo Gosei Co., Ltd.) as a naphthoquinonediazide compound (B), and 1.40 g of PGMEA and 0.65 g of DAA as solvents (C) were mixed under yellow light. After shaking and stirring, the resulting mixture was filtered through a 0.45-μm filter to obtain a composition 14.

Comparative Example 4

First, 2.71 g of the R-3 solution in EDM (35.2%) as polysiloxane (A), 0.30 g of TDF-517 (produced by Toyo Gosei Co., Ltd.) as a naphthoquinonediazide compound (B), 0.50 g of EDM and 0.30 g of DAA as solvents (C), and 6.20 g of the solution of TR-550 in DAA (B-1) as metallic compound particles (D) were mixed under yellow light. After shaking and stirring, the resulting mixture was filtered through a 0.45-μm filter to obtain a composition 15.

The obtained compositions were used to prepare cured films by the above-described method, which were evaluated for refractive index, heat resistance, light resistance, resolution, and residue. Their compositions and evaluation results are shown in Tables 4 and 5.

TABLE 4

| | (I) resin composition | | | | | | | | |
|---|---|---|---|---|---|---|---|---|---|
| No. | resin composition name | poly-siloxane (A) | proportion (% by mass) | metallic compound particle (D) | proportion (% by mass) | naphthoquin-onediazide compound (B) | proportion (% by mass) | solvent (C) | proportion (% by mass) |
| Example 5 | composition 8 | P-1 | 10 | B-1 | 12.5 | C-1 | 2.5 | DAA | 75 |
| Example 6 | composition 9 | P-1 | 20 | B-1 | 7 | C-1 | 2.5 | DAA | 75 |
| Example 7 | composition 10 | P-1 | 12.5 | B-1 | 10 | C-1 | 2.5 | DAA | 75 |
| Example 8 | composition 11 | P-1 | 4 | B-1 | 14 | C-1 | 2 | DAA | 80 |
| Example 9 | composition 12 | P-1 | 2 | B-1 | 16 | C-1 | 2 | DAA | 80 |
| Example 10 | composition 13 | P-1 | 10 | B-2 | 12.5 | C-1 | 2.5 | DAA | 75 |

TABLE 4-continued (I) resin composition

| No. | resin composition name | poly-siloxane (A) | proportion (% by mass) | metallic compound particle (D) | proportion (% by mass) | naphthoquin-onediazide compound (B) | proportion (% by mass) | solvent (C) | proportion (% by mass) |
|---|---|---|---|---|---|---|---|---|---|
| Example 11 | composition 14 | BP-1 (P-1) | 12 | BP-1 (B-1) | 15 | C-1 | 3 | PGMEA/DAA | 15/55 |
| Comparative Example 4 | composition 15 | R-3 | 13 | B-1 | 17 | C-1 | 3 | EDM | 67 |
| Comparative Example 5 | composition 16 | R-3 | 20 | B-1 | 7 | C-1 | 3 | EDM | 70 |

TABLE 5

| No. | refractive index | heat resistance (%) | light resistance (%) | resolution | residue |
|---|---|---|---|---|---|
| Example 5 | 1.79 | 4.3% | 4.5% | A | B |
| Example 6 | 1.63 | 4.6% | 4.6% | A | A |
| Example 7 | 1.75 | 4.5% | 4.7% | A | A |
| Example 8 | 1.83 | 4.2% | 4.5% | A | B |
| Example 9 | 1.90 | 4.1% | 4.4% | B | B |
| Example 10 | 1.75 | 4.0% | 4.5% | A | B |
| Example 11 | 1.79 | 4.2% | 4.4% | A | A |
| Comparative Example 4 | 1.70 | 3.8% | 11.4% | A | B |
| Comparative Example 5 | 1.60 | 4.4% | 13.5% | A | B |

The compositions 8 and 10 to 14 obtained in Examples 5 and 7 to 11 showed high refractive index, good heat resistance and light resistance, and excellent resolution, and were suitable for microlens and waveguide of solid state image sensors, as compared with the composition 15 obtained in Comparative Example 4. The composition 9 obtained in Example 6 showed high refractive index, good heat resistance and light resistance, and excellent resolution, and were suitable for microlens and waveguide of solid state image sensors, as compared with the composition 16 obtained in Comparative Example 5.

The cured films obtained from the positive photosensitive resin composition containing polysiloxane (A), a naphthoquinonediazide compound (B), a solvent (C), and metallic compound particles (D) of the present invention in Examples 5 to 11 all showed excellent properties. Even when the amount of the metallic compound particles (D) was increased, the cured film successfully obtained high refractive index without significant impairment in heat resistance, light resistance, resolution, and residue properties.

INDUSTRIAL APPLICABILITY

Coatings and cured films formed by the resin compositions of the present invention are suitably used for various electronic components, particularly for optical devices, such as solid state image sensors, anti-reflective films, anti-reflective plates, optical filters, and displays. Specific examples of use include optical waveguides and microlenses formed in solid state image sensors, planarization materials for TFT substrates for displays, and protective films for liquid crystal displays and color filters. Due to their good flatness, they are suitably used as planarization materials for optical waveguides formed on solid state image sensors. They can also be used as buffer coats, interlayer insulating films, and various protective films for semiconductor devices.

The invention claimed is:

1. A positive photosensitive resin composition comprising:
polysiloxane (A),
a naphthoquinonediazide compound (B), and
a solvent (C);
wherein the polysiloxane (A) has at least one structure selected from the following general formulae (1) to (3), and has at least one structure selected from the following general formulae (4) to (6);

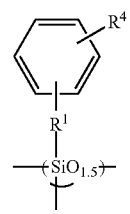
(1)

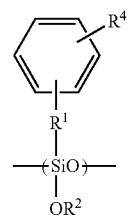
(2)

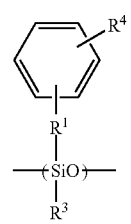
(3)

wherein, in the general formulae (1) to (3),
$R^4$ represents a $C_2$-$C_6$ hydrocarbon group having an unsaturated double bond;
$R^1$ represents a single bond or a $C_1$-$C_4$ alkylene group;
$R^2$ in the general formula (2) represents a hydrogen atom or a $C_1$-$C_4$ alkyl group; and
$R^3$ in the general formula (3) represents an organic group;

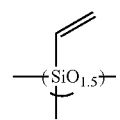
(4)

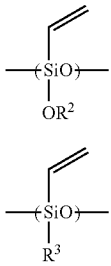

wherein,
R² in general formula (5) represents a hydrogen atom or a $C_1$-$C_4$ alkyl group; and
R³ in the general formula (6) represents an organic group.

2. The positive photosensitive resin composition according to claim 1, wherein the amount of the styryl group present in the structures represented by the general formulae (1) to (3) is 10 to 90 mol % relative to silicon atoms contained in polysiloxane (A).

3. The positive photosensitive resin composition according to claim 1, wherein the amount of the vinyl group present in the structures represented by the general formulae (4) to (6) is 1 to 20 mol % relative to silicon atoms contained in polysiloxane (A).

4. The positive photosensitive resin composition according to claim 1, further comprising metallic compound particles (D).

5. The positive photosensitive resin composition according to claim 4, wherein the metallic compound particles (D) comprise at least one type of particles selected from titanium oxide particles and zirconium oxide particles.

6. The positive photosensitive resin composition according to claim 4, wherein the amount of the metallic compound particles (D) is 40 to 70% by mass relative to the total solid content.

7. A method of producing a cured film, comprising the successive steps of:
(I) applying the positive photosensitive resin composition according to claim 1 on a substrate to form a coating film;
(II) exposing the coating film to light; and
(III) heating the exposed coating film.

8. A method of producing a cured film, comprising the successive steps of:
(i) applying the positive photosensitive resin composition according to claim 1 on a substrate to form a coating film;
(ii) subjecting the coating film to a pattern exposure step followed by a development step using a developer to remove exposed portion of the coating film;
(iii) exposing the remaining coating film after the development step; and
(iv) heating the exposed coating film.

9. A cured film obtained from the positive photosensitive resin composition according to claim 1.

10. A solid state image sensor comprising the cured film according to claim 9.

* * * * *